United States Patent

[11] 3,611,177

[72] Inventor Jan Helbers
Rochester, Mich.
[21] Appl. No. 825,234
[22] Filed May 16, 1969
[45] Patented Oct. 5, 1971
[73] Assignee Energy Conversion Devices, Inc.
Troy, Mich.

[54] ELECTROLUMINESCENT RELAXATION OSCILLATOR FOR DC OPERATION
12 Claims, 8 Drawing Figs.

[52] U.S. Cl. .......... 331/46, 307/318, 313/108 B, 315/169 TV, 317/234 V, 317/237, 331/56, 331/107 R, 331/143, 340/166
[51] Int. Cl. .......... H01j 1/62, H03k 3/57
[50] Field of Search .......... 331/107, 111, 143, 46, 56; 317/234 (10), 237; 313/108 R, 108 B; 315/169, 169 TV, 171, 226; 340/166; 307/318

[56] References Cited
UNITED STATES PATENTS

| | | | |
|---|---|---|---|
| 2,713,132 | 7/1955 | Matthews et al. | 317/236 |
| 3,060,345 | 10/1962 | Sack, Jr. | 315/169 |
| 3,066,242 | 11/1962 | Boyd | 331/107 X |
| 3,271,591 | 9/1966 | Ovshinsky | 317/234 X |
| 3,448,425 | 6/1969 | Shanefield et al. | 331/107 X |

*Primary Examiner*—Roy Lake
*Assistant Examiner*—Siegfried H. Grimm
*Attorneys*—Wallenstein, Spangenberg, Hattis & Strampel and Edward G. Fiarito

ABSTRACT: An electroluminescent circuit for DC operation comprising a discrete electroluminescent element the capacitive reactance characteristic of which is utilized in a circuit containing a bidirectional threshold switching device having inherent turn-on time delay and inherent recovery time delay characteristics and, together with suitable circuit resistance form a bistable electroluminescent relaxation oscillator circuit which has stable ON and stable OFF conditions with a DC operating potential continuously applied thereto. When a start signal, which may be a pulse of predetermined time duration and amplitude, is applied to the electroluminescent circuit the circuit will begin to oscillate at a frequency determined by, among other things, the electrical values of the circuit components and the amplitude of the applied voltage and will continue to oscillate as a relaxation oscillator after termination of the start signal to energize the electroluminescent element of the circuit so that light will be emitted therefrom. When a stop signal of the proper time duration is applied to the electroluminescent relaxation oscillator circuit the circuit will stop oscillating and the electroluminescent element will no longer emit light.

Inventor
Jan Helbers
By: Wallenstein, Spangenberg, Hattis & Strampel attys.

ELECTROLUMINESCENT RELAXATION OSCILLATOR FOR DC OPERATION

This invention relates generally to means for controlling the energization of electroluminescent light-emitting materials, and more particularly to a circuit arrangement which, together with the electroluminescent element, forms a bistable self-sustaining relaxation oscillator circuit operable by direct current voltage to emit light from the electroluminescent element.

Electroluminescent phosphor materials are well known in the art for emitting light through flat transparent surfaces when energized by a source of alternating current voltage. These electroluminescent phosphor materials when deposited between spaced-apart electrode-forming materials, one of which is transparent, form a capacitorlike component responsive only to alternating current voltage and block the passage of direct current voltage. Such electroluminescent phosphor materials require only a small amount of power to energize the same to emit light therefrom. Since the electroluminescent materials form capacitorlike components it is the rate of change of voltage and/or current applied to such materials which enable them to become energized to a light emitting state. The application of a direct current voltage to such electroluminescent phosphor materials will cause only the initial application of such direct current voltage to develop a short duration light-emitting pulse and after the charge across the electroluminescent material has reached the value of the applied direct current voltage no further light output is obtained. That is to say that electroluminescent materials are energizable from alternating current voltage and not from direct current voltage although such energization from direct current voltage is highly desirable.

Accordingly, one of the primary objects of this invention is to provide means whereby electroluminescent materials can be energized by a direct current voltage source to emit light therefrom.

Briefly, this invention utilizes the capacitive reactance characteristic of electroluminescent materials together with a two terminal bidirectional threshold switching means and suitable resistance means to form an electroluminescent self-sustaining relaxation oscillator circuit, which, under certain operating conditions, may have two stable states of operation when a direct current voltage of a predetermined voltage amplitude is continuously applied thereto. That is, the electroluminescent circuit of this invention may be either in a stable ON condition or in a stable OFF condition, and by the application of suitable start or stop signals to the electroluminescent circuit, the previously existing condition can be readily altered to the next condition, i.e., from OFF to ON or ON to OFF. Therefore, the electroluminescent circuit of this invention has great utility in many applications, as where, for example, a plurality of such circuits are utilized in an electroluminescent array to form electroluminescent screens or display panels to produce or reproduce images as graphs, maps, television images, or any other information indicia to be displayed.

The two terminal bidirectional threshold switching means used in this invention is a one-layer threshold switching device having substantially identical conduction characteristics for positive and negative applied voltages. The device initially represents a very high resistance in response to an applied voltage of either polarity below an upper threshold voltage value and a very low resistance in response to an applied voltage of either polarity above the upper threshold voltage value of the threshold switching device. The threshold switching device automatically resets itself in a very short time to its high-resistance condition when the current therethrough drops below a minimum holding current value which is near zero. Semiconductor materials used to form threshold switching devices of this type, most advantageously, are of the type disclosed in U.S. Pat. No. 3,271,591 granted to Stanford R. Ovshinsky on Sept. 6, 1966 and sometimes referred to therein as "mechanism devices without memory." By varying the semiconductor composition or the treatment of the material disclosed in the above mentioned patent, the upper and lower threshold voltage values and the blocking or leakage condition thereof are readily varied to obtain the desired range of conditions necessary for the particular circuits in which such threshold switching devices are to be used. Blocking resistance values in the order of 1 to 10 megohms and higher are readily obtainable, as well as somewhat lower blocking resistance values.

It has been discovered that the semiconductor materials disclosed in the above mentioned patent form threshold switching devices which have inherent characteristics that are at variance with the ideal theoretical switch and these characteristics have been carefully studied. An inherent characteristic of particular importance is that of a time delay between the time a threshold voltage is applied to the threshold switching device and the time the threshold switching device actually changes from its high-resistance blocking condition to its low-resistance conducting condition, but once switching occurs it is substantially instantaneous, as for example, in the order of nanoseconds. However, the turn-on time delay of such threshold switching devices will vary with changes in applied voltage in excess of the threshold voltage value of the particular device involved, an increase in applied voltage from the threshold voltage value to a greater value causing a decrease in the turn-on time delay. Therefore, if a voltage pulse having an amplitude equal to or greater than the threshold voltage value of the threshold switching device involved is applied thereto but exists for a period of time less than the inherent time delay corresponding to that particular voltage amplitude, the threshold switching device will not be rendered conductive. Hence, if an operating potential of alternating current voltage is applied to the threshold switching device used in accordance with this invention and which operating potential provides pulses which exist for a time duration less than the inherent turn-on time delay corresponding to the amplitude of the applied voltage, then a peak voltage value in excess of the threshold voltage value of the threshold switching devices may be applied thereto without rendering the threshold switching device conductive.

Yet another inherent characteristic of the threshold switching device used in this invention is that of a time delay of the recovery of the threshold voltage valve back to its original of initial threshold voltage value after the threshold switching device is turned off as a result of decreasing current through the threshold switching device below a minimum holding current value. That is, there will exist a substantially reduced threshold voltage value after the switching device is turned off and which reduced threshold voltage value will increase with increasing time to its original or initial threshold voltage value. Therefore, if a pulse or voltage is applied to the threshold switching device within the recovery time delay period after it is rendered nonconductive, this pulse need only have an amplitude equal to the then existing threshold voltage value to again render the threshold switching device conductive.

By utilizing the inherent recovery time delay of the threshold switching device materials disclosed in the above mentioned patent an electroluminescent circuit can be formed which will operate on DC voltage and which circuit will have two stable operational conditions, i.e., a stable ON condition and a stable OFF condition, when a voltage of predetermined magnitude is continuously applied to the electroluminescent circuit. The threshold switching device used in this invention can be arranged either to control the discharge of current from the electroluminescent element or to control the charge of current to the electroluminescent element to form a self-sustaining relaxation oscillator circuit.

Many objects, features and advantages of this invention will be more fully realized and understood from the following detailed description when taken in conjunction with the accompanying drawings wherein like reference numerals throughout the various views of the drawings are intended to designate similar elements or components.

Figures 1, 2, 3, 4, 5, 6, 7, 8:
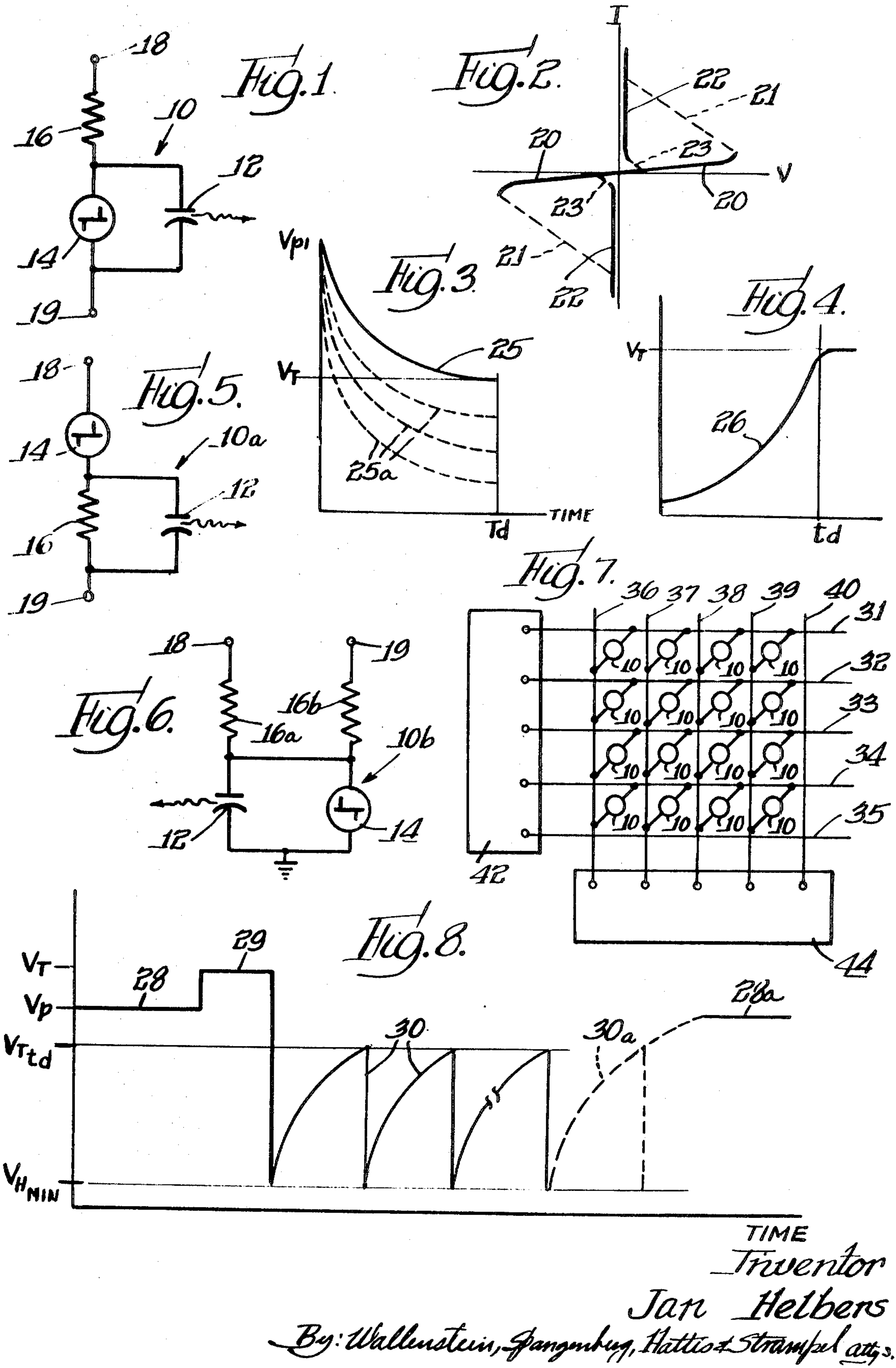
FIG. 1 is a schematic diagram illustrating one form of electroluminescent relaxation oscillator circuit constructed in accordance with this invention.
FIG. 2 is a voltage current characteristic of the threshold switching device used in accordance with this invention.
FIG. 3 is a graphic representation of the inherent turn-on time delay of the threshold switching device used in this invention.
FIG. 4 is a graphic representation of the inherent recovery time delay of the threshold switching device used in this invention.
FIG. 5 is an alternate circuit arrangement of the electroluminescent relaxation oscillator circuit of this invention.
FIG. 6 is still another alternate circuit arrangement of the electroluminescent relaxation oscillator circuit of this invention.

FIG. 7 is a diagrammatic illustration of a small portion of an electroluminescent array wherein a plurality of electroluminescent relaxation oscillator circuit can be used to form a display screen; and FIG. 8 is a graphic representation of the voltage applied to and generated within the electroluminescent relaxation oscillator circuit of this invention during stable OFF and stable ON condition with start and stop signals shown for controlling the operation of the electroluminescent relaxation oscillator circuit.

Referring now to FIG. 1 there is seen an electroluminescent relaxation oscillator circuit designated generally by reference numeral 10 and constructed in accordance with the principles of this invention. The electroluminescent relaxation oscillator circuit 10 includes an electroluminescent element 12 which forms a capacitor in the circuit for storing and discharging electrical energy. Connected in parallel with the electroluminescent element 12 is a two terminal bidirectional threshold switching device 14 which has inherent turn-on time delay and inherent recovery time delay characteristics, and, most advantageously, is formed of a semiconductor material similar to that disclosed in U.S. Pat. No. 3,271,591, granted to Stanford R. Ovshinsky on Sept. 6, 1966. The inherent turn-on time delay of the threshold switching device 14 is that time between the application of a voltage equal to or in access of the threshold voltage value of the threshold switching device and the time the threshold switching device actually is rendered conductive. The threshold voltage value of the threshold switching device 14, immediately after it is rendered nonconductive, is substantially less than the initial threshold voltage value and progressively increases to the initial threshold voltage value during what is referred to as the recovery time delay.

Connected in series with the electroluminescent element 12 and the threshold switching device 14 is a resistor 16 which together with the capacitive value of the electroluminescent element 12 form an RC time constant, which, among other things, will determine the frequency at which the electroluminescent relaxation oscillator circuit 10 will oscillate. The electroluminescent circuit 10 is a two terminal circuit having terminals 18 and 19 for connection to an operating voltage source of direct current voltage.

For a better understanding of the threshold switching device used in this invention reference is now made to FIGS. 2, 3 and 4 which illustrate the various electrical characteristics of the threshold switching device 14. The threshold switching device 14 is symmetrical in its operation, it that it blocks current substantially equally in each direction when in its high resistance or blocking condition and it conducts current substantially equally in each direction in its low resistance or conducting condition. The switching between the blocking and conducting conditions are extremely rapid after the inherent time delay. FIG. 2 is an I–V curve illustrating the AC operation of the threshold switching device 14 it being understood that either the first or third quadrant alone will represent the application of a direct current voltage (DC). Considering a DC voltage applied across the threshold switching device 14, represented by the first quadrant of FIG. 2, the threshold switching device 14 is normally in its high resistance blocking condition, and, as the DC voltage is increased, the voltage current characteristics of the device are illustrated by the curve 20, the electrical resistance of the device being high and substantially blocking the current flow therethrough. When the voltage is increased to a threshold voltage value, the high electrical resistance of the semiconductor material substantially instantaneously decreases in at least one path through the semiconductor material forming the threshold switching device 14 to a low electrical resistance, the substantially instantaneous switching being indicated by the curve 21. This provides a low electrical resistance conducting condition for conducting current therethrough. The low electrical resistance is many orders of magnitude less than the high electrical resistance. The conducting condition is illustrated by the curve 22 and it is noted that there is a substantially linear current characteristic and a substantially constant voltage characteristic which is the same for increases and decreases in current. In other words, current is conducted at a substantially constant voltage. In the low-resistance current conducting condition the semiconductor material forming the threshold switching device 14 has a voltage drop which is a minor fraction of the voltage drop in the high-resistance blocking condition.

As the voltage is decreased, the current decreases along the curve 22 and when the current decreases below a minimum current holding value, the electrical resistance of the conductive path through the semiconductor material quickly returns to the high electrical resistance, as illustrated by the curve 23, to reestablish the high-resistance blocking condition. In other words, a minimum holding current is required to maintain the threshold switching device 14 in its conductive condition and when the current falls below the minimum holding current value the low electrical resistance condition of the threshold switching device 14 immediately turns to the high electrical resistance condition.

When AC is applied to the threshold switching device 14 the I–V curve is illustrated by quadrants 1 and 3 of FIG. 2. Here threshold switching device 14 is in its blocking condition when the peak value of the applied alternating current voltage is below the threshold voltage value of the device, the blocking condition being illustrated by curves 20—20 in both quadrants 1 and 3. When, however, the peak value of the applied alternating current voltage increases above the threshold voltage value of the device, the device is substantially instantaneously switched along the curves 21—21 to the conducting condition illustrated by the curves 22—22, the device switching during each half cycle of the applied alternating current voltage. As the applied alternating current voltage nears zero so that the current through the threshold switching device 14 falls below the minimum holding current value, the device switches along the curves 23—23 from the low electrical resistance condition to the 23—electrical resistance condition illustrated by the curves 20—20, this switching occuring near the end of each half cycle.

Referring now to FIG. 3 there is illustrated the inherent turn-on time delay characteristic of the threshold switching device 14 where the normal threshold voltage value is indicated at $V_T$ and the inherent time delay at the threshold voltage value is indicated at $T_d$ and the variation in time delay is illustrated by the curve 25. The threshold switching device 14 has an inherent time delay between the time the threshold voltage is applied thereto and the time the switching device is actually rendered conductive, and this time is inversely proportional to the amount of overvoltage applied to the threshold switching device, as illustrated by the curve 25. By way of example, the normal time delay may be about $10^{15}$ seconds and the normal threshold voltage value may be about 21 volts, these values being alterable by, among other things, changing the composition of the semiconductor material used in forming the threshold switching device 14 or by varying the thickness of the layer or film forming the threshold switching device. However, it will be noted that the time delay $T_d$ will decrease with increase of applied voltage between the $V_T$ and $V_{P1}$. Therefore, the time duration of the applied voltage to the threshold switching device 14 need only be as long as the time delay corresponding to the time delay for the voltage value in excess of $V_T$.

FIG. 4 illustrates the inherent recovery time delay $t_d$ of the threshold switching device 14 to its normal threshold voltage value after the threshold switching device is rendered nonconductive, this being indicated by the curve 26. Here it can be seen that immediately after the threshold switching device 14 is rendered nonconductive it will have a substantially reduced threshold voltage valve which increases with time until the normal threshold voltage value $V_T$ is again reached, this being somewhere in the order of 8 to 15 microseconds depending on, among other things, the composition of the material used to form the threshold switching device 14, it being understood that lesser or greater recovery time delays may be involved. If the threshold switching device 14 is operated by a series of pulse voltages, as for example, alternating current voltage or pulsating direct current voltage, only an initial pulse need have a voltage amplitude and time duration corresponding to the initial threshold voltage value and time delay of FIG. 3, or a lesser time delay corresponding to the overvoltage of the initial pulse. However, if a subsequent pulse of voltage is applied to the threshold switching device 14 before the threshold switching device has fully recovered to its normal or initial threshold voltage value, as indicated at $V_T$ in FIG. 4, this subsequent pulse of the voltage need only have an amplitude equal to the then existing threshold voltage value, which may be anywhere between 0.1 $V_T$ to $V_T$ depending upon the point in time the next pulse or voltage is applied. The turn-on time delay of FIG. 3 may persist regardless of the time at which the subsequent pulse of voltage is applied to the threshold switching device 14 the only difference being a decrease or shifting of the entire curve 25 as indicated by the family of curves shown in broken lines at 25*a*. Therefore, in accordance with this invention, once the threshold switching device is rendered conductive, it can be successively rendered conductive by closely spaced pulses which have voltage amplitudes less than the initial normal threshold voltage value of the device. However, if the applied voltage, whether direct current or pulses, is extinguished for the time interval $t_d$, corresponding to the inherent time delay of FIG. 4, the threshold switching device 14 will fully recover to its initial normal threshold voltage value and no longer will be rendered conductive as a result of pulses having voltage amplitude below the threshold voltage value of the threshold switching device.

Therefore, when the threshold switching device 14 is utilized in the circuit of FIG. 1 it, together with the electroluminescent element 12, will form a bistable electroluminescent relaxation oscillator circuit having stable ON and stable OFF conditions while a given predetermined direct current voltage is continuously applied to terminals 18 and 19. When the electroluminescent relaxation oscillator circuit 10 of FIG. 1 is rendered operative a sawtooth voltage waveform will be developed across the electroluminescent element 12 which acts as a capacitor. The frequency of oscillation of the electroluminescent relaxation oscillator circuit 10 is determined by the amplitude of the applied voltage, the threshold voltage value of the threshold switch device 14 and the RC time constant formed by the capacitance value of the electroluminescent element 12 and the resistor 16. The bistable nature of the electroluminescent relaxation oscillator circuit 10 is basically determined by the recovery time delay $t_d$, as illustrated in FIG. 4, and the frequency at which the circuit oscillates. The major advantage of the electroluminescent relaxation oscillator circuit 10 is that it is capable of operation from a direct current voltage source of either polarity rather than requiring a more complex alternating current voltage source for energization of the electroluminescent element 12.

Referring now to FIG. 8 there is illustrated a complex waveform showing the bistable operation of the electroluminescent relaxation oscillator circuit 10 of FIG. 1. Here the amplitude of the continuously applied direct current voltage is indicated by the initial portion of the waveform at 28 and may persist for any desired period of time. During this period of time the electroluminescent element 12 will charge to the value of the applied voltage. When it is desired to energize the electroluminescent relaxation oscillator circuit 10 a start signal, indicated by reference numeral 29, may be superimposed on the continuously applied DC voltage 28 and is of an amplitude and time duration sufficient to initially render the threshold switching device 14 conductive and rapidly discharge the electroluminescent element 12 therethrough. The resistance value of the resistor 16 is sufficiently high to provide a current flow below the minimum holding current value of the threshold switching device 14. Therefore, after substantially complete discharge of the electroluminescent element 12 the threshold switching device 14 is again rendered nonconductive to provide a high-resistance blocking path to current flow. At this point, the electroluminescent element will begin to charge as indicated by the first of a series of sawtooth waveforms 30 following the start pulse 29. The RC time constant of the resistor 16 and capacitance of the electroluminescent element 12 is selected so that the capacitor will charge to a value equal to the then existing threshold voltage value of the threshold switching device 14 before the inherent time delay $t_d$ has lapsed. This will cause the threshold switching device 14 to again be rendered conductive and discharge the electroluminescent element 12. This cyclic operation will continue at a fixed frequency for an indefinite period of time until the voltage applied to terminals 18 and 19 is reduced below the then existing threshold voltage value of the threshold switching device 14 or until a suitable stop pulse of other stop signal information is applied to the circuit as indicated by the broken line curve 30*a*. This may be accomplished in several ways, as for example, by momentarily removing power from terminals 18 and 19 for a period of time sufficient to allow the threshold switching device to recover to a threshold voltage value greater than the applied voltage, or by superimposing on the applied direct current voltage a voltage pulse of opposite polarity for a period of time sufficient to allow the threshold switching device to recover, at which time the voltage applied across the threshold switching device 14 is again the applied voltage as indicated by reference numeral 28*a*.

FIG. 5 illustrates an alternate form of the electroluminescent circuit of FIG. 1 and is here designated generally by reference numeral 10*a*. Here the electroluminescent element 12 is placed in parallel with the resistor 16 while the threshold switching device 14 is connected in series with the electroluminescent element 12 and the resistor 16. The difference here is that there is no initial charge on the electroluminescent element 12 during periods of nonoperation of the circuit while a direct current voltage of predetermined voltage amplitude is continuously applied thereto. However, when a start signal is applied to terminals 18 and 19 the threshold switching device is rendered conductive quickly to charge the electroluminescent circuit 12 substantially to the amplitude of the applied voltage. The resistance value of resistor 16 is relatively large so as to maintain the current flow therethrough well below the minimum holding current value of the threshold switching device 14. After the electroluminescent element 12 is charged, current flow through the threshold switching device 14 is reduced below the minimum holding current value and the threshold switching device is rendered nonconductive. However, the discharge of the electroluminescent element 12 through the resistor 16 is sufficiently rapid so that it is substantially discharged within a period of time less than the inherent recovery time delay $t_d$ of the threshold switching device 14. This will cause the threshold switching device to be rendered conductive in response to the applied voltage, which is less than the initial normal threshold voltage valve of the switching device if the applied voltage is greater than the then existing threshold voltage value.

FIG. 6 is still another alternate arrangement of the electroluminescent relaxation oscillator circuit of this invention and is here designated generally by reference numeral **10*b*. The electroluminescent element 12 and threshold switching device 14 are connected in parallel with one end thereof connected to ground potential and the other end thereof connected to one end of a pair of resistors 16*a* and 16*b*. The free end of resistors 16*a* and 16*b* are connected to terminals 18 and 19 which, in turn, are arranged for connection to a direct current voltage source or sources of substantially the same amplitude and same polarity. When a voltage amplitude below the threshold voltage value of the threshold switching device 14 is applied to both the terminals 18 and 19 the electroluminescent relaxation oscillator circuit 10*b* will not oscillate or energize the electroluminescent element 12. If the voltage on one of the lines 18 or 19 is increased to a value greater than the threshold voltage value of the threshold switching device 14, but below a predetermined maximum value, the voltage drop between the resistors 16*a* and 16*b*, where these resistors are of the same resistance value, is equally divided so that the voltage applied to the parallel circuit of electroluminescent element 12 and threshold switching device 14 is half the increase of that applied to either terminal 18 or 19. However, should the other of the terminals also be subjected to an increase in voltage greater than the threshold voltage value of the threshold switching device 14 then and only then will the electroluminescent circuit 10*b* break into oscillation to energize the electroluminescent element 12**. This circuit arrangement has particular advantages when used in connection with an X–Y electroluminescent display array wherein a single transparent film electrode is used on the light emitting side of the display array and is connected to ground potential and the X–Y address lines are formed behind the array.

Any one of the electroluminescent circuits shown in FIGS. 1, 5 and 6 can be used to form an electroluminescent array in any suitable manner. One exemplary arrangement of forming an electroluminescent array is illustrated in FIG. 7 where there is shown a plurality of horizontal electrodes 31, 32, 33, 34 and 35 and a plurality of vertical electrodes 36, 37, 38, 39 and 40 arranged in a cross-grid pattern to form a plurality of circuit junctures therebetween for receiving an electroluminescent relaxation oscillator circuit 10. Each of the electrodes 31–35 have one end thereof connected to a voltage source and control signal apparatus 42 while each of the electrodes 36–40 are connected to a voltage source and control signal apparatus 44. Each of the apparatus 42 and 44 provide direct current voltage and suitable start and stop signals to control the operation of selected ones of the electroluminescent relaxation oscillator circuits 10 between their stable ON and stable OFF condition selectively to form desired light emitting patterns on the display screen formed thereby. The cross-grid electrodes may be formed by deposited layers or films of transparent electrode forming materials such as tin oxide. For example, the electrodes 31–35 may be formed on a transparent substrate such as glass or clear plastic and the electroluminescent relaxation oscillator circuits 10 having the discrete components thereof deposited or otherwise formed at a multitude of aligned locations on the electrodes 31–35, and thereafter the electrodes 36–40 deposited to make connection with the electroluminescent relaxation oscillator circuits. The voltage source and control signal apparatus 42 and 44 continuously apply direct current voltage to the electrodes 31–35 and 36–40, the amplitude of which is below the initial normal threshold voltage value of the threshold switching devices 14 and each of the electroluminescent relaxation oscillator circuits 10 is maintained in its stable OFF condition. However, when a start signal is applied to a selected pair of electrodes, one electrode being of the horizontal group and the other electrode of the vertical group, the electroluminescent relaxation oscillator circuit at the juncture of the selected pair of electrodes will be rendered operative and thereafter will continue to oscillate to energize its associated electroluminescent element 12 and emit light therefrom. The energized electroluminescent element 12 will continue to emit light until a suitable stop signal is applied to the selected juncture to render the electroluminescent relaxation oscillator circuit inoperative for a period of time sufficient to allow the threshold switching device 14 to recover substantially to its initial normal threshold voltage value or at least to a threshold voltage value greater than the applied direct current voltage. Therefore, this invention provides means whereby electroluminescent elements can be energized when connected to a direct current voltage source, and when the voltage amplitude of the voltage source is maintained below the threshold voltage value of the threshold switching device used, the electroluminescent relaxation oscillator circuit formed by this invention will have two stable operating conditions. It will be understood from the foregoing detailed description that many variations and modifications may be effected without departing from the spirit and scope of the novel concepts of this invention.

I claim:

1. A relaxation oscillator circuit to be operated from DC voltage source means providing an output of predetermined voltage amplitude, comprising: voltage input terminal means to which said DC voltage source means is to be connected; a capacitive element; threshold switching means connected in circuit with said capacitive element and voltage input terminal means, said threshold switching means having a given initial threshold voltage value greater than the amplitude of the output of said DC voltage source means and an inherent recovery time delay period wherein the threshold voltage value immediately after said threshold switching means is rendered nonconductive is temporarily less than said given initial threshold voltage value and said predetermined voltage amplitude and progressively increases to said given initial threshold voltage value over said period; and resistance means in circuit with said capacitive element and said threshold switching means to form a relaxation oscillator circuit when said voltage input terminal means is connected to said DC voltage source means which circuit has an RC time constant wherein, once said threshold switching means is momentarily initially rendered conductive, said capacitive element charges or discharges in a time less than said recovery time delay period to effect the application of a voltage to said threshold switching means which reaches or exceeds the lowered threshold voltage value thereof to switch the same momentarily to a conductive state to initiate a new cycle of operation.

2. The relaxation oscillator circuit of claim 1 wherein said threshold switching means is in parallel with said capacitive element and said resistance means is in series therewith so once said threshold switching means is momentarily rendered nonconductive, the voltage on said capacitive element builds up each cycle to a voltage reaching or exceeding said lowered threshold voltage value in less time than said period, to render the threshold switching means conductive to discharge the capacitive element; said threshold switching means is rendered nonconductive when current flow therethrough goes below a given holding current value and said resistance means is of a value to reduce the current therethrough below said holding current value under steady state conditions.

3. The relaxation oscillator circuit of claim 2 wherein said resistance means is formed by a pair of resistance components each having one end thereof connected to a common juncture of said capacitive element and said threshold switching means and the other ends of said resistance components are respectively connected to separate terminals of said input voltage terminal means to receive the outputs of separately controlled voltage sources connected respectively between said separate terminals and a common point at the opposite ends of said capacitive element and threshold switching means, and each having an output variable between amplitudes above and below said initial threshold voltage value.

4. The relaxation oscillator circuit according to claim 3 wherein each of said resistance components is of the same resistance value.

5. The relaxation oscillator of claim 3 wherein there is provided first and second direct current voltage and control circuit means, said other end of one of said pair of resistance components being connected to said first direct current voltage and control circuit means and said other end of the other of said pair of resistance components being connected to said second direct current voltage and control circuit means, a start signal from either one but not the other of said first and second direct current voltage and control circuit means being voltage divided between said pair of resistance components to remain below the threshold voltage value of said threshold switching means associated with each relaxation oscillator circuit, thus being insufficient to render said relaxation oscillator operative, and a start signal from both of said direct current voltage and control circuit means being sufficient to render the relaxation oscillator circuit operative.

6. The relaxation oscillator circuit of claim 1 wherein said capacitive element and said resistance means are connected in parallel, and said threshold switching means is connected in series therewith so once said threshold switching means is momentarily rendered conductive the capacitive element will charge to said output of said DC voltage source means, said threshold switching means is rendered nonconductive when current flow therethrough goes below a given holding current value and said resistance means is of a value to reduce the current therethrough below said holding current value under steady state conditions; and said resistance means and said capacitive element having an RC time constant which effects discharge of said capacitive element in less than said recovery time delay period.

7. The relaxation oscillator circuit of claim 1 wherein said capacitive element is a visible electroluminescent element which emits light when the same is charged and discharged during the oscillation of the oscillator.

8. The relaxation oscillator of claim 1 wherein there is provided direct current voltage providing and start and stop means connected to said voltage input terminal means (a) for providing thereacross a normally continuous DC voltage having said amplitude below said initial threshold voltage value and a momentary start voltage providing a voltage across said threshold switching means at or in excess of said initial threshold voltage value to initiate conduction thereof and the oscillation of the relaxation oscillator circuit and (b) for stopping the oscillation when desired by rendering said threshold switching means nonconductive for a period where the threshold voltage value thereof rises to a value which prevents the conduction thereof by the voltages present in the circuit.

9. A display array to be operated from DC voltage source means providing an output of predetermined voltage amplitude, said array comprising: means for forming a plurality of pairs of circuit junctures corresponding in number to the number of desired light emitting portions of said array; a relaxation oscillator circuit connected across each of said pairs of circuit juncture, each of said relaxation oscillator circuits including light emitting and capacitive means, threshold switching means connected in circuit with said light emitting and capacitive means, said threshold switching means having a given initial threshold voltage value greater than the amplitude of the output of said DC voltage source means and an inherent recovery time delay period wherein the threshold voltage value immediately after said switching means is rendered nonconductive is temporarily less than said given initial threshold voltage value and said predetermined voltage amplitude and progressively increases to said given initial threshold voltage value over said period, and resistance means in circuit with said light emitting and capacitive means and said threshold switching means to form a relaxation oscillator circuit having an RC time constant wherein, once said threshold switching means is momentarily initially rendered conductive, said light emitting and capacitive means charges or discharges in a time less than said recovery time period to effect the application of a voltage to said threshold switching means which reaches or exceeds the lowered threshold voltage value thereof to switch the same momentarily to a conductive state to initiate a new cycle of operation and to effect emission of light; means for continuously applying said direct current voltage source means across each of said plurality of junctures, said direct current voltage having a predetermined voltage amplitude less than said given initial threshold voltage value of said threshold switching means, and including means for applying start signals to selected ones of said circuit junctures to momentarily cause the voltage thereacross to increase to a value equal to or greater than said given initial threshold voltage value least as long as the inherent turn-on time delay of said threshold to initially render said threshold switching means conductive.

10. The display array of claim 8 wherein said threshold switching means of each relaxation oscillator circuit is in parallel with said light emitting and capacitive means and said resistance means is in series therewith so one said threshold switching means is momentarily rendered nonconductive the voltage on said light emitting and capacitive means builds up each cycle to a voltage reaching or exceeding said lowered threshold voltage value in less time than said period to render the threshold switching means conductive to discharge the light emitting and capacitive means, said threshold switching means is rendered nonconductive when current flow therethrough goes below a given holding current value and said resistance means is of a value to reduce the current therethrough below said holding current value under steady state conditions.

11. The display array of claim 9 wherein said light emitting and capacitive means and said resistance means of each of said relaxation oscillator circuits are connected in parallel, and said threshold switching means is connected in series therewith so once said threshold switching means is momentarily rendered conductive the light emitting and capacitive means will charge to said output of said DC voltage source, said threshold switching means is rendered nonconductive when current flow therethrough goes below a given holding current value and said resistance means is of a value to reduce the current therethrough below said holding current valve under steady state conditions, and said resistance means and said light emitting and capacitive means having an RC time constant which effects discharge of said light emitting and capacitive means in less than said recovery time delay period.

12. The display array of claim 9 wherein there is provided direct current voltage providing and start and stop means selectively connectable across said pairs of circuit junctures (a) for providing across the selective pair of circuit junctures a normally continuous DC voltage having said amplitude below said initial threshold voltage value of the associated threshold switching means and a momentary start voltage providing a voltage across the associated threshold switching means at or in excess of said initial threshold voltage valve to initiate conduction thereof and the oscillation of the associated relaxation oscillator circuit, and (b) for stopping the oscillation when desired by rendering the associated threshold switching means nonconductive for a period where the threshold voltage value thereof rises to a value which prevents the conduction thereof by the voltage then present in the circuit.